(12) United States Patent
Yamamoto et al.

(10) Patent No.: US 7,211,138 B2
(45) Date of Patent: May 1, 2007

(54) HARD FILM, METHOD OF FORMING THE SAME AND TARGET FOR HARD FILM FORMATION

(75) Inventors: Kenji Yamamoto, Kobe (JP); Toshiki Sato, Kobe (JP)

(73) Assignee: Kabushiki Kaisha Kobe Seiko Sho (Kobe Steel, Ltd.), Kobe-shi (JP)

( * ) Notice: Subject to any disclaimer, the term of this patent is extended or adjusted under 35 U.S.C. 154(b) by 376 days.

(21) Appl. No.: 10/769,913

(22) Filed: Feb. 3, 2004

(65) Prior Publication Data

US 2004/0157090 A1    Aug. 12, 2004

(30) Foreign Application Priority Data

Feb. 7, 2003    (JP)    ............... 2003-031299

(51) Int. Cl.
*C23C 14/06*    (2006.01)
(52) U.S. Cl. .................. 106/286.2; 428/697; 428/698; 428/699; 428/704
(58) Field of Classification Search ............. 106/286.2; 428/697, 698, 699, 704
See application file for complete search history.

(56) References Cited

U.S. PATENT DOCUMENTS 5,981,049 A    11/1999    Ohara et al.
6,296,928 B1    10/2001    Yamada et al.
6,586,122 B2*    7/2003    Ishikawa et al. ............ 428/699
6,824,601 B2*    11/2004    Yamamoto et al. ...... 106/286.2
2003/0148145 A1    8/2003    Yamamoto et al.

FOREIGN PATENT DOCUMENTS

| JP | 3-120354 | 5/1991 |
| JP | 10-18024 | 1/1998 |
| JP | 2001-121314 | * 5/2001 |
| JP | 2002-337006 | 11/2002 |

OTHER PUBLICATIONS

U.S. Appl. No. 10/743,735, filed Dec. 24, 2003, Yamamoto et al.
U.S. Appl. No. 10/807,332, filed Mar. 24, 2004, Yamamoto et al.
U.S. Appl. No. 10/025,653, filed Dec. 26, 2001, Yamamoto et al.
U.S. Appl. No. 10/200,535, filed Jul. 23, 2002, Yamamoto et al.
U.S. Appl. No. 10/321,462, filed Dec. 18, 2002, Morikawa et al.

* cited by examiner

Primary Examiner—Archene Turner
(74) Attorney, Agent, or Firm—Oblon, Spivak, McClelland, Maier & Neustadt, P.C.

(57) ABSTRACT

A hard film is formed of a material having composition indicated by a chemical formula: $(Ti_aAl_bV_cSi_dB_f)(C_{1-e}N_e)$, in which subscripts a, b, c, d, f and e indicate atomic ratios of Ti, Al, V, Si, B and N, respectively, and meet relational expressions: $0.02 \leq a \leq 0.5$, $0.4 < b \leq 0.8$, $0.05 < c$, $0 \leq d \leq 0.5$, $0 \leq f \leq 0.1$, $0.01 \leq d+f \leq 0.5$, $0.5 \leq e \leq 1$ and $a+b+c+d=1$. The hard film is harder than and more excellent in wear resistance than TiAlN films and conventional (TiAlV) (CN) films.

6 Claims, 2 Drawing Sheets

HARD FILM, METHOD OF FORMING THE SAME AND TARGET FOR HARD FILM FORMATION

BACKGROUND OF THE INVENTION

1. Field of the Invention

The present invention relates to a hard film, a method of forming the same, and a target for hard film formation. More particularly, the present invention relates to a wear-resistant hard film for improving the wear resistance of cutting tools, such as carbide tips, drills and milling cutters, machine parts, and dies for processing metals by plastic working, a method of forming the hard film, and a target used as a source material.

2. Description of the Related Art

Conventional cutting tools of cemented carbides, cermets or high-speed steels have been coated with a hard film of TiN, TiCN or TiAlN to improve the wear resistance of the cutting tools. Hard films of titanium nitride, titanium carbide and titanium carbide-nitride generally used for coating cutting tools for high-speed cutting and for cutting hard workpieces, such as workpieces of hardened steels have been replaced by films of Ti—Al composite nitride (hereinafter referred to as "TiAlN") excellent in wear resistance. Addition of a third element to a two-element material, such as TiAlN, has been made in recent years in an attempt to improve the properties of the two-element material. Films of TiAlVN or (TiAlV) (CN) disclosed in, for example, JP-A 3-120354, JP-A 10-18024, U.S. Pat. No. 5,981,049 and U.S. Pat. No. 6,296,928 exhibit excellent cutting performance in cutting workpieces of materials having low hardness, such as S50C (JIS). The cutting performance of those prior art films in cutting workpieces of hard materials, such as quenched SKD (JIS) is not necessarily satisfactory. It is desired to develop films excellent in wear resistance and having higher hardness to cope with progressively increasing demand for high-speed cutting operations at higher cutting speeds. A hard film proposed in JP-A 2002-337006 is formed of a material containing at least one of Al and metals of Groups IV, V and VI, and Si, and at least one of nonmetallic elements, i.e., N, B, C and O. The description of the prior art hard film mentions only a Si content of 50% or below in connection with the optimum composition of the material. Actually, hard film having a cutting ability exceeding that of the conventional TiAlN film cannot be formed of a material prepared by simply combining the foregoing elements.

The present invention has been made in view of the foregoing circumstances and it is therefore an object of the present invention to provide a hard film having excellent wear resistance and having a high hardness higher than that of the conventional TiAlN film or (TiAlV) (CN) film, a method of forming the hard film, and a target for forming the hard film.

SUMMARY OF THE INVENTION

According to the present invention, a hard film is formed of a material having the composition indicated by a chemical formula: $(Ti_a Al_b V_c Si_d B_f) (C_{1-e} N_e)$, wherein subscripts a, b, c, d, e and f indicate the atomic ratios of Ti, Al, V, Si, N and B, respectively, and meet relational expressions:

$0.02 \leq a \leq 0.5$
$0.4 < b \leq 0.8$
$0.05 < c$
$0 \leq d \leq 0.5$
$0 \leq f \leq 0.1$
$0.01 \leq d+f \leq 0.5$
$0.5 \leq e \leq 1$
$a+b+c+d+f=1$.

The hard film defined as above may be formed of a material having composition indicated by a chemical formula $(Ti_a Al_b V_c Si_d) (C_{1-e} N_e)$, namely f=0 in the above expressions, and the atomic ratio d may meet expression $0.01 \leq d \leq 0.5$.

Instead, the hard film defined as above may be formed of a material having the composition indicated by a chemical formula $(Ti_a Al_b V_c B_f) (C_{1-e} N_e)$, namely d=0 in the above expressions, and the atomic ratio f may meet expression $0.01 \leq f \leq 0.1$.

Still instead, the hard film defined as above may be formed of a material having the composition indicated by a chemical formula: $(Ti_a Al_b V_c Si_d B_f) (C_{1-e} N_e)$, and the atomic ratios d and f may meet expressions $0.01 \leq d \leq 0.5$ and $0.01 \leq f \leq 0.1$.

According to the present invention, a hard film forming method of forming any one of the foregoing hard films according to the present invention comprises the steps of: evaporating and ionizing component metals of a target in a film-forming gas; and producing a plasma by promoting the ionization of the metals and the film-forming gas.

In the hard film forming method according to the present invention, the component metals of the target may be evaporated and ionized by an arc-ionization plating process using arc discharge, and a magnetic field represented by diverging or parallel lines of magnetic force extending forward substantially perpendicularly to an evaporating surface of the target may be created to promote the ionization of the film-forming gas around a workpiece for film formation.

According to the present invention, a target for hard film formation contains Ti, Al, V and at least either of Si and B, and have a relative density of 95% or above.

The target according to the present invention may be a compound containing a Ti—Si compound and/or a Ti—B compound.

According to the present invention, a target for hard film formation is formed of a material having the composition indicated by a chemical formula: $(Ti_x Al_y V_z Si_w B_v)$, wherein subscripts x, y, z, w and v indicate the atomic ratios of Ti, Al, V, Si and B, respectively, and meet relational expressions $0.02 \leq x \leq 0.5$
$0.4 < y \leq 0.8$
$0.05 < z$
$0 \leq w \leq 0.5$
$0 \leq v \leq 0.1$
$0.01 \leq w+v \leq 0.5$
$x+y+z+w+v=1$.

The target for hard film formation defined as above may be formed of a material having the composition indicated by a chemical formula: $(Ti_x Al_y V_z Si_w)$, namely v=0 in the above expressions, and the atomic ratio w may meet expression $0.01 \leq w \leq 0.1$ Instead, the target for hard film formation defined as above may be formed of a material having the composition indicated by a chemical formula: $(Ti_x Al_y V_z B_v)$, namely w=0 in the above expressions, and the atomic ratio v may meet expression $0.01 \leq v \leq 0.1$.

Still instead, the target for hard film formation defined as above may be formed of a material having the composition indicated by a chemical formula: $(Ti_x Al_y V_z Si_w B_v)$, and the atomic ratios w and v may meet expressions $0.01 \leq w \leq 0.5$ and $0.01 \leq v \leq 0.1$.

The hard film of the present invention is excellent in wear resistance and has a high hardness higher than those of the conventional TiAlN and (TiAlV) (CN) films. A cutting tool coated with the hard film of the present invention is capable of efficiently achieving a cutting operation at a high cutting speed.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
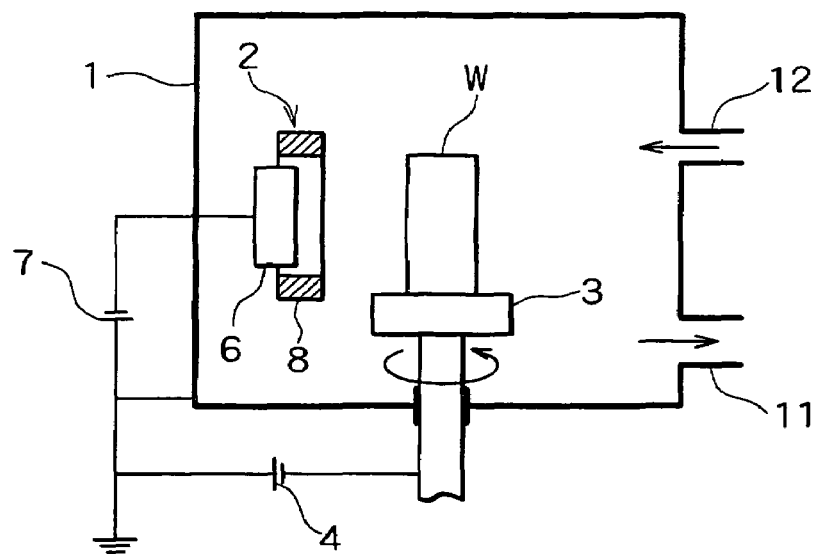
FIG. 1 is a typical view of an arc-ionization plating apparatus (AIP apparatus) to be used for carrying out a hard film forming method embodying the present invention.

The inventors of the present invention proceeded with studies to develop hard films having unparalleled high wear resistance for coating cutting tools and found that the increase of the hardness of hard films improves the wear resistance of hard films effectively. It was found through the study of the effect of the Al content and the V content of (TiAlV) (CN) forming hard films and that of addition of Si or B to (TiAlV) (CN) on increasing the hardness of hard films of (TiAlV) (CN) and, consequently, increases the wear resistance of the hard film greatly. The present invention has been made on the basis of those findings of those studies.

A hard film of the present invention is formed of a material containing a material having the composition indicated by a chemical formula: $(Ti_a Al_b V_c Si_d) (C_{1-e} N_e)$, wherein $0.02 \leq a \leq 0.5$ $0.4 < b \leq 0.8$ $0.05 < c$ $0.01 \leq d \leq 0.5$ $0.5 \leq e \leq 1$ $a+b+c+d=1$ (Subscripts a, b, c, d and e indicate atomic ratios of Ti, Al, V, Si and N, respectively.)

Reasons for defining the composition of the material forming the hard film as above will be described.

The upper limit of Al content in atomic ratio is determined on the basis of the following reasons. An excessively large Al content increases Al—N ionic bonds excessively causing the adhesive property of the hard film to decrease. Therefore, the Al content in atomic ratio must be 0.8 or below, preferably, 0.75 or below. An Al content of 0.4 in atomic ratio or below has no effect of increasing the hardness and hence the Al content must be 0.4 in atomic ratio or above.

The hardness increasing effect of a V content below 0.05 in atomic ratio is insignificant. A Si content below 0.01 in atomic ratio is scarcely effective in increasing the hardness of the hard film. A Si content exceeding 0.5 in atomic ratio reduces the hardness and adhesive property of the hard film. Therefore, an upper limit for Si content is 0.5 in atomic ratio.

Preferable Si content is dependent on the composition of the material forming the hard film. Addition of Si to the material having an Al content of 0.6 or above in atomic ratio reduces the hardness of the film. A preferable Si content for a material having an Al content of 0.6 in atomic ratio or above is in the range of 0.01 to 0.1 in atomic ratio. A preferable Si content for a material having an Al content below 0.6 in atomic ratio or is in the range of 0.1 to 0.5 in atomic ratio, more preferably, in the range of 0.2 to 0.4 in atomic ratio.

The Ti content is the remainder having the composition other than the Al, Si and V contents. A Ti content below 0.02 in atomic ratio reduces the hardness of the hard film, and a Ti content exceeding 0.5 in atomic ratio reduces the amount of elements that increases the hardness, namely, Al, V and Si, contained in the material. Therefore, an upper limit for Ti content is 0.5 in atomic ratio.

When C is added to the material to increase the hardness of the film formed of the material by precipitating highly hard carbides, such as TiC, VC and SiC in the material, it is desirable that the C content is approximately equal to the Ti+V+Si content. If the C content is excessively high, an excessively large amount of unstable aluminum carbide that reacts easily with water and decomposes. Therefore, the C content 1−e in atomic ratio of the material is below 0.5; that is, the atomic ratio e must be 0.5 or above. Preferably, the atomic ratio e is 0.7 or above, more preferably, 0.8 or above. Most preferably, e=1.

The hard film of the present invention may be a single-layer hard film of the material meeting the foregoing conditions or may be a laminated hard film formed by laminating different films meeting the foregoing conditions. When necessary, the hard film of the present invention may be a laminated hard film constructed by laminating a film of TiN, TiAlN, TiCrAlN, TiCN, TiAlCN, TiCrAlCN, TiC or the like to one of or both the surfaces of a single-layer hard film or a laminated hard film of (TiAlVSi) (CN) according to the present invention.

The hard film of the present invention may be a laminated hard film constructed by laminating at least one metal layer or an alloy layer containing at least one of elements of Groups IVA, VA and VIA, such as Cr, Ti and Nb, Al and Si to one of or both the surfaces of a single-layer or a laminated hard film according to the present invention. The alloy layer may be formed of a Ti—Al alloy or the like.

When the hard film of the present invention is (1) a laminated hard film consisting of films respectively formed of materials having different kinds of composition meeting the requisite conditions of the present invention, (2) a laminated hard film consisting of a hard film of the present invention and a layer of a material different from that of the hard film, such as a metal nitride layer, a metal carbide layer of a metal carbide-nitride layer, or (3) a hard film constructed by laminating metal layers or alloy layers containing at least one of metals of Groups IVA, VA and VIA, Al and Si, the thickness of each of the component layers must be in the range of 0.005 to 2 μm. It is desirable that either the single-layer hard film or the laminated hard film of the present invention has a thickness in the range of 0.5 to 20 μm. The hard film having an excessively small thickness below 0.5 μm is unsatisfactory in wear resistance. The hard film having an excessively big thickness exceeding 20 μm is subject to chipping or peeling off during machining and hence unsatisfactory. The thickness of the hard film is more desirably 1 to 15 μm.

The hard film of the present invention is formed of the material containing a material having the composition indicated by the chemical formula: $(Ti_aAl_bV_cSi_d)(C_{1-e}N_e)$, and is not formed only of the material having the composition indicated by the chemical formula: $(Ti_aAl_bV_cSi_d)(C_{1-e}N_e)$. The hard film of the present invention may be formed only of the material having the composition indicated by the chemical formula: $(Ti_aAl_bV_cSi_d)(C_{1-e}N_e)$, or may be formed of a material containing other components in addition to the material having the composition indicated by the chemical formula: $(Ti_aAl_bV_cSi_d)(C_{1-e}N_e)$. When B is added to the material having the composition indicated by the chemical formula: $(Ti_aAl_bV_cSi_d)(C_{1-e}N_e)$, B and N produce a BN compound in the hard film to enhance the heat-resistance of the hard film. Since an excessive B content reduces the hardness of the hard film, a preferable B content is in the range of 0.01 to 0.1 in atomic ratio.

A hard film of the present invention may be formed of a material containing a material indicated by a chemical formula: $(Ti_aAl_bV_cB_f)(C_{1-e}N_e)$ obtained by replacing Si of the material having the composition indicated by the chemical formula: $(Ti_aAl_bV_cSi_d)(C_{1-e}N_e)$ with B. The B content f in atomic ratio of this material is in the range of 0.01 to 0.1.

In the hard films of $(Ti_aAl_bV_cSi_d)(C_{1-e}N_e)$ and $(Ti_aAl_b-V_cB_f)(C_{1-e}N_e)$, when d=f, the $(Ti_aAl_bV_cSi_d)(C_{1-e}N_e)$ film has more improved oxidization resistance than the $(Ti_aAl_bV_cB_f)(C_{1-e}N_e)$ film and the $(Ti_aAl_bV_cB_f)(C_{1-e}N_e)$ film has lower friction ratio than $(Ti_aAl_bV_cSi_d)(C_{1-e}N_e)$ film due to BN compositions in the film.

The hard film of the present invention is formed by a hard film forming method according to the present invention. The hard film forming method makes a reaction gas containing C and N reacts effectively with Al, V, Ti and Si. It is effective to evaporate and ionize metals in an atmosphere of a film-forming gas to promote the production of a plasma of the ionized film-forming gas and the metals during film deposition.

An arc-ionization plating process that evaporates and ionizes metals forming a target by using arc discharge preferably creates a magnetic field represented by diverging or parallel lines of magnetic force extending forward substantially perpendicularly to the evaporating surface of the target to promote the ionization of the film-forming gas around a workpiece.

An arc-ionization plating apparatus (AIP apparatus) has difficulty in forming the hard film of the present invention if an evaporation source is a conventional cathode evaporation source that creates a magnetic field behind a target. It is very effective in forming the hard film of the present invention to promote the ionization of a film-forming gas by the agency of magnetic force by disposing a magnet beside or in front of a target to creates a magnetic field represented by diverging or parallel lines of magnetic force extending forward substantially perpendicularly to the evaporating surface of the target.

Referring to FIG. 1, the AIP apparatus includes a vacuum vessel 1 provided with an exhaust port 11 for evacuation and a gas supply port 12 through which the film-forming gas is supplied, an arc-evaporation source 2 that evaporates and ionizes a target as a cathode by arc discharge, a table 3 for supporting a workpiece W, such as a cutting tool, and a bias power source 4 that applies a negative bias voltage through the table 3 to the workpiece W.

The arc-evaporation source 2 includes a target 6 as a cathode, an arc power source 7 connected to the target 6 and the vacuum vessel 1 as an anode, and a magnet (permanent magnet) 8 that creates a magnetic field represented by diverging or parallel lines of magnetic force extending forward substantially perpendicularly to the evaporating surface S of the target 6 near to the workpiece W. A preferable magnetic flux density in the vicinity of a central part of the workpiece W is 10 G or above, more preferably, 30 G or above. The lines of magnetic force extending substantially perpendicularly to the evaporation surface of the target 6 include those extending at angles in the range of 0° to 30° to a normal to the evaporation surface of the target 6.

Figure 2:
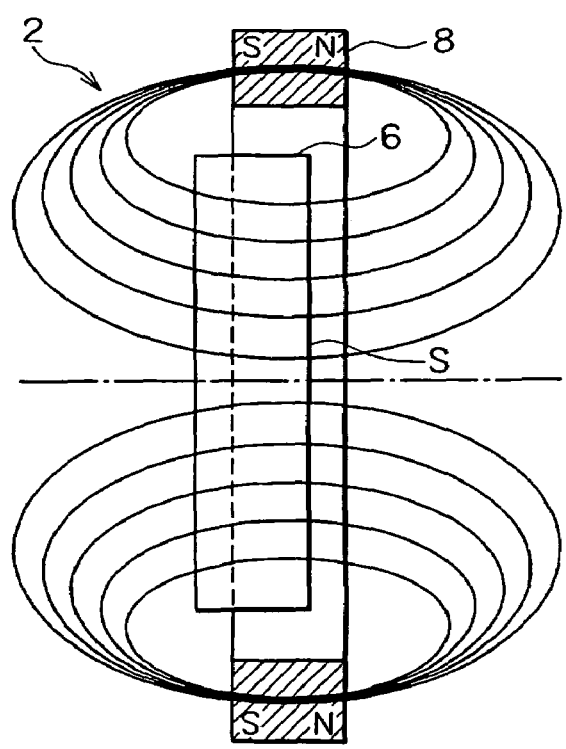
FIG. 2 is a typical view of an essential part of an arc-evaporation device for carrying out a hard film forming method embodying the present invention.
Figure 3:
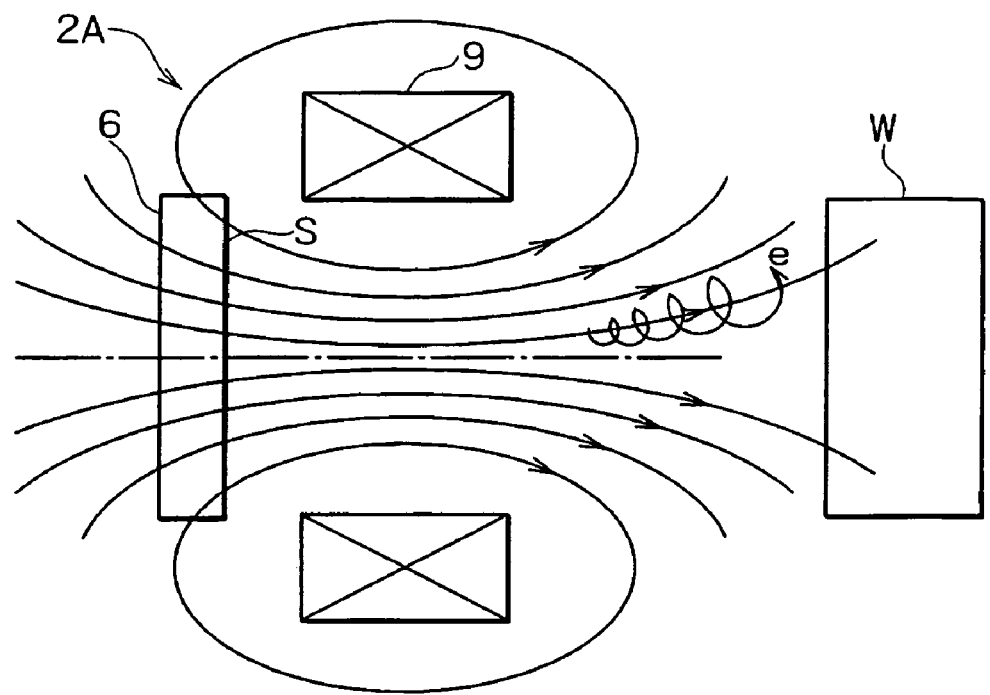
FIG. 3 is a typical view of an essential part of another arc-evaporation device for carrying out a hard film forming method embodying the present invention.

FIG. 2 is a schematic, enlarged sectional view of an essential part of the arc-evaporation source 2. The magnet 8, namely, magnetic field creating means, is positioned so as to surround the evaporation surface S of the target 6. An electromagnet including a coil and a power supply may be used as the magnetic field creating means instead of the magnet 8. The magnet 8 may be disposed so as to surround a space extending in front of the evaporation surface S of the target 6 on the side of the workpiece W as shown in FIG. 3. Although the vacuum vessel 1 of the AIP apparatus shown in FIG. 1 serves as an anode, a cylindrical anode may be disposed so as to surround a space extending in front of a surface on the side of the target 6. Shown in FIG. 3 are an electromagnet (magnetic field creating means) 9, a workpiece W and an anodic evaporation source 2A.

An arc-evaporation source 102 included in a conventional AIP apparatus is provided with an electromagnet 109 to direct an arc discharge toward a target 106. However, since the electromagnet 109 is disposed behind the target 106, portions of lines of magnetic force in the vicinity of the evaporation surface of the target 106 are parallel to the evaporation surface of the target 106, and the lines of magnetic force do not extend near to a workpiece W.

The shape of the magnetic field created by the arc-evaporation source 2 included in the AIP apparatus employed in the present invention is different from that of the magnetic field created by the arc-evaporation source 102 of the conventional AIP apparatus. Consequently, a spreading mode of the plasma produced by ionizing the film-forming gas by the arc-evaporation source 2 included in the AIP apparatus employed in the present invention is different from that of a plasma produced by ionizing a film-forming gas by the arc-evaporation source 102 of the conventional AIP apparatus.

Figure 4:
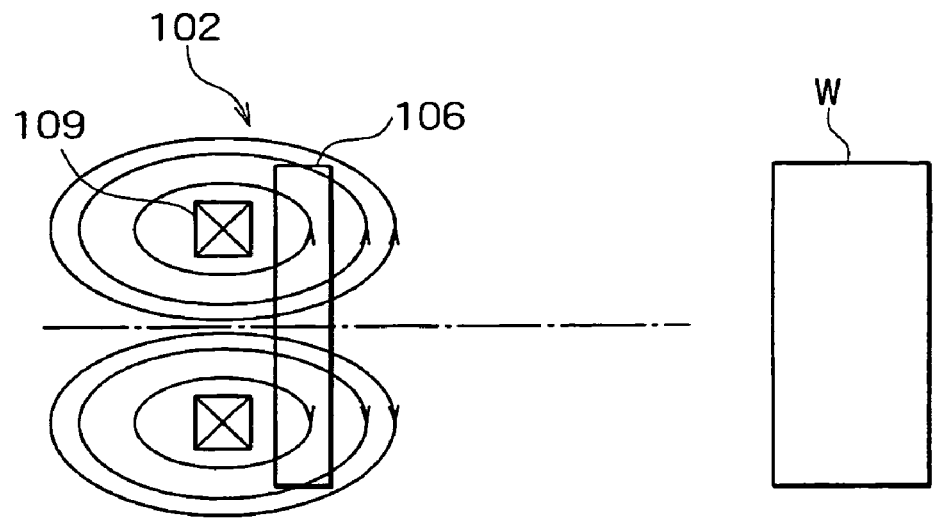
FIG. 4 is a typical view of an arc-evaporation device included in a conventional arc-ionization plating apparatus (AIP apparatus).

As shown in FIG. 3, some of electrons e produced by arc discharge swirl around the lines of magnetic force, and the swirling electrons e collide against nitrogen molecules and such contained in the film-forming gas to ionize the film-forming gas so that a plasma may be produced. The arc-evaporation source 102 of the conventional AIP apparatus shown in FIG. 4 creates a magnetic field represented by lines of magnetic force that extend only in the vicinity of the target 106; consequently, part of the plasma in the vicinity of the target 106 has the highest density and part of the plasma in the vicinity of the workpiece W is considerably low. The arc-evaporation source 2 shown in FIG. 2 or the arc-evaporation source 2A shown in FIG. 3 creates a magnetic field represented by lines of magnetic force extending to the workpiece W; consequently, part of the plasma in the vicinity of the workpiece W is far higher than that of the plasma produced by the arc-evaporation source 102 of the conventional AIP apparatus.

The difference between the conventional AIP apparatus and the AIP apparatus employed in the present invention in the distribution of lines of magnetic force and the density of part of the plasma in the vicinity of the workpiece results in the remarkable difference between deposited films deposited by the conventional AIP apparatus and those deposited by the AIP apparatus employed in the present invention in crystal structure and characteristic of deposited films.

The film-forming process does not necessarily need to be the AIP process and may be any suitable film-forming process, provided that the film-forming process is capable of efficiently ionizing metals and the film-forming gas. A pulse sputtering process and an ion-beam assist deposition process using a nitrogen ion beam are examples of possible film-forming process.

The foregoing film-forming process is applicable to forming a hard film containing Al, V, Ti and B.

A vapor-phase coating process that evaporates and ionizes a target to deposit a hard film on a workpiece, such as an ion-plating process or a sputtering process, is an effective method of forming the hard film of the present invention. Stable electric discharge cannot be maintained during the film-forming process and a hard film of the homogeneous composition cannot be deposited if the target has undesirable properties. The following knowledge was acquired through studies of the properties of targets to deposit hard films of the present invention having excellent wear resistance.

It was found that the condition of electric discharge can be stabilized during film deposition and the hard film of the present invention can be efficiently formed when the target has a relative density of 95% or above. A target having a relative density below 95% has coarse structure having micropores. When such a target having micropores is used, the component metals of the target are evaporated irregularly, a film deposited by using the target of the inhomogeneous composition and an irregular thickness. Part having micropores of the target are subject to local, rapid wear during film formation shortening the life of the target. If a target has such many micropores that cause the local, rapid wear, the target is not strong enough to avoid cracking. The present invention provides on the basis of those findings obtained through the studies a target for forming a hard film containing Ti, Al and V, and at least one of Si and B, and having a relative density not lower than 95%.

The composition of a hard film formed by the vapor-phase coating process, such as the AIP process, is dependent on the composition of the target. Therefore, it is preferable that the composition of the target is the same as that of a hard film to be formed. To form a hard film according to the present invention having excellent wear resistance, it is desirable to use a target for hard film formation formed of a material having the composition indicated by a chemical formula: $(Ti_xAl_yV_zSi_w)$, wherein subscripts x, y, z and w indicate the atomic ratios of Ti, Al, V and Si, respectively, and meet relational expressionss $0.02 \leq x \leq 0.5$
$0.4 < y \leq 0.8$
$0.05 < z$
$0.01 \leq w \leq 0.5$
$x+y+z+w=1$.

It is desirable that the target further containing B in an atomic ration in the range of 0.01 to 0.1. It is also desirable to use a target having the composition similar to that of the aforesaid target according to the present invention and containing B in an atomic ration in the range of 0.01 to 0.1 instead of Si.

A hard film of the inhomogeneous composition and portions having different wear resistances is formed even if a target of the foregoing composition if the composition of the target is inhomogeneous. When the composition of the target is inhomogeneous, portions of the target have different electric conductivities and melting points, respectively. Such a target makes the condition of electric discharge unstable and, consequently, films cannot be satisfactorily formed. Preferably, the range of irregularity having the composition is within 0.5 at. %.

Preferably, the target of the present invention contain at least one of Si and B in a Ti—Si compound and a Ti—B compound respectively for the following reasons. In some cases, the condition of electric discharge from the target changes microscopically during film formation using sputtering or arc discharge and the condition of discharge becomes unstable if Si grains or B grains are surrounded by conductive Ti and Al grains. This problem will not arise when the target contains Si and B in a Ti—Si compound and Ti—B compound because a Ti—Si compound, such as $Ti_5Si_3$ or $TiSi_2$, and a Ti—B compound, such as $TiB_2$, are sufficiently conductive.

Ti—B and Ti—Si compounds in the target can be detected by X-ray diffraction. In order to obtain the desirable effect, more than 80% of B and Si in the target exist in the form of compound. In order to make B and Si in the target exist in the form of compound, for example, $T_5Si_3$ and $TiB_2$ are added to the target in the form of compound.

The present invention is not intended to specify a target manufacturing method. One of effective methods of manufacturing the target conforming to the present invention comprises homogeneously mixing a mixture prepared by mixing Ti powder, V powder, Al powder, and either Si powder or B powder of desired particle sizes in a predetermined mixing ratio by a V-type mixer to obtain mixed powder, and compacting the mixed powder by a cold isostatic pressing process (CIP process) or a hot isostatic pressing process (HIP process) to form a target. A hot extrusion process or an ultrahigh-pressure sintering process can manufacture the target.

The target can be manufactured by a method that subjects the mixed powder to a hot pressing process (HP process). However, this method has difficulty in forming a target having a high relative density because V contained in the mixed powder is a metal having a high melting point. The target can be manufactured by subjecting an alloy powder of a desired kind of composition to a CIP process, a HIP process or a melting-and-solidifying process. Although the method that subjects the alloy powder to a CIP process of a HIP process is capable of manufacturing a target of the homogeneous composition, the same method is unable to manufacture a target having a high relative density because the alloy powder is difficult to sinter. Although the method that subjects the alloy powder to a melting-and-solidifying process is capable of manufacturing a target of the comparatively homogeneous composition, the target is liable to crack and shrinkage cavities are liable to be formed in the target when the target solidifies. Thus, it is difficult to manufacture a target conforming to the present invention by those methods.

In the description of the hard film forming method according to the present invention, the lines of magnetic force extending substantially perpendicularly to the evaporation surface of the target include those extending at angles in the range of 0° to 30° to a normal to the evaporation surface of the target.

EXAMPLES

Examples of the present invention and comparative examples will be described.

Example 1 and Comparative Example 1

An alloy target 6 containing Ti, V, Al and Si was placed in the AIP apparatus shown in FIG. 1 as a cathode. Tips of a cemented carbide and two-edge ball end mills of a radius of 5 mm formed of a cemented carbide were placed on the table 3 as workpieces W, and then the vacuum vessel 1 was evacuated. The workpieces were heated at 500° C. with a heater placed inside the vacuum vessel 1. After cleaning the interior of the vacuum vessel 1 by Ar ion, nitrogen gas was supplied into the vacuum vessel 1, pressure in the vacuum vessel 1 was adjusted to 2.66 Pa, and power was supplied to the AIP apparatus to start arc discharge. Hard films of about 3 µm in thickness were formed over the surfaces of the workpieces. A bias voltage in the range of 30 to 200 V was applied to the workpieces to maintain the workpieces at a negative potential with respect to a ground potential during film formation.

The hard films were subjected to composition analysis and Vickers hardness measurement. The composition of the hard films was measured by an electron probe x-ray microanalyzer(EPMA). The hard films contained, in addition to Ti, V, Al, Si, B and N, O and C as impurities and had an oxygen content of 1 at. % or below and a carbon content of 2 at. % or below.

The end mills were subjected to cutting tests to evaluate the wear resistance of the hard films. The end mills coated with the hard films were subjected to cutting tests under Cutting condition A and Cutting condition B. Wear width in a middle part of the edge was measured.

Cutting condition A
Material of workpiece: SKD61 (JIS) (HRC50)
Cutting speed: 220 m/min
Feed: 0.06 mm/edge
Axial depth of cut: 5 mm
Radial depth of cut: 0.6 mm
Length of cut: 50 m
Mode: Down cut, dry cut, air blow only
Cutting condition B
Material of workpiece: S55C (JIS) (HB220)
Cutting speed: 100 m/min (5300 rpm)
Feed: 0.05 mm/edge (530 mm/min)
Axial depth of cut: 3 mm
Radial depth of cut: 0.5 mm
Length of cut: 50 m
Mode: Down cut, dry cut, air blow only Results of the cutting tests were evaluated in terms of the magnitude of wear of the most wearable part of the specimens, i.e., in terms of the magnitude of boundary wear in the specimens caused during cutting tests under Cutting condition A, and the magnitude of wear of tips of the specimens caused during cutting tests under Cutting condition B.

Table 1 shows the measured composition and measured Vickers hardness of the hard films and the results of cutting tests. In table 1, the term "Wear width A" signifies the width of boundary wear caused by test cutting under Cutting condition A, and the term "Wear width B" signifies the width of wear in the tip caused by test cutting under Cutting condition B.

As obvious from Table 1, the hard films have the composition indicated by a chemical formula: $(Ti_aAl_bV_c)$ $(C_{1-e}N_e)$ or a chemical formula: $(Ti_aAl_bV_cSi_d)$ $(C_{1-e}N_e)$. In the compositions of some of the hard films, e=1.

In Table 1, Specimens Nos. 1 to 4, 8, 13, 18 to 20 and 28 are the hard films in Comparative example 1, and Specimens Nos. 5 to 7, 9 to 12, 14 to 17 and 21 to 27 are hard films in Example 1.

The hard films in Example 1, as compared with those in Comparative example 1, have a high hardness. The wear width A and/or the wear width B of the hard films in Example 1 is small, which proves that the hard films in Example 1 are excellent in wear resistance.

Example 2 and Comparative Example 2

An alloy target 6 containing Ti, V, Al and Si was placed in the AIP apparatus shown in FIG. 1 as a cathode. Tips of a cemented carbide and two-edge ball end mills of a radius of 5 mm formed of a cemented carbide were placed on the table 3 as workpieces W, and then the vacuum vessel 1 was evacuated. The workpieces were heated at 500° C. with the heater placed inside the vacuum vessel 1. Nitrogen gas or a mixed gas of nitrogen gas and methane gas was supplied into the vacuum vessel 1, pressure in the vacuum vessel 1 was adjusted to 2.66 Pa, and power was supplied to the AIP apparatus to start arc discharge. Hard films of about 3 µm in thickness were formed over the surfaces of the workpieces. A bias voltage in the range of 30 to 200 V was applied to the workpieces to maintain the workpieces at a negative potential with respect to a ground potential during film formation.

The hard films were subjected to composition analysis and Vickers hardness measurement. The composition of the hard films was measured by an EPMA. The hard films contained, in addition to Ti, V, Al, Si, B, N and C, O as an impurity and had an oxygen content of 1 at. % or below.

The end mills were subjected to cutting tests to evaluate the wear resistance of the hard films under the same cutting conditions as the end mills coated with the hard films in Example 1, namely, Cutting condition A and Cutting condition B. Wear width in a middle part of the edge was measured.

Table 2 shows the measured composition and measured Vickers hardness of the hard films and the results of cutting tests.

As obvious from Table 2, the hard films have the composition indicated by a chemical formula: $(Ti_aAl_bV_c)$ $(C_{1-e}N_e)$ or a chemical formula: $(Ti_aAl_bV_cSi_d)$ $(C_{1-e}N_e)$. The hard films contain N in different atomic ratios e meeting a relational expression: $0.3 \leq e \leq 1$, and contain C in different atomic ratios 1–e.

In Table 2, Specimens Nos. 1 to 3, 8, 13 and 18 are the hard films in Comparative example 2, and Specimens Nos. 4 to 7, 9 to 12 and 14 to 17 are hard films in Example 2.

The hard films in Example 2, as compared with those in Comparative example 2, have a high hardness. The wear width A and/or the wear width B of the hard films in Example 1 is small, which proves that the hard films in Example 2 are excellent in wear resistance. The hard films in Example 2 having a higher C atomic ratio and a lower N atomic ratio have a higher hardness and a smaller wear width A, and are more excellent in wear resistance.

Example 3 and Comparative Example 3

An alloy target 6 containing Ti, V, Al, Si and B was placed in the AIP apparatus shown in FIG. 1 as a cathode. Tips of a cemented carbide and two-edge ball end mills of a radius of 5 mm formed of a cemented carbide were placed on the table 3 as workpieces W, and then the vacuum vessel 1 was evacuated. The workpieces were heated at 500° C. with the heater placed inside the vacuum vessel 1. Nitrogen gas was supplied into the vacuum vessel 1, pressure in the vacuum vessel 1 was adjusted to 2.66 Pa, and power was supplied to the AIP apparatus to start arc discharge. Hard films of about 3 µm in thickness were formed over the surfaces of the workpieces. A bias voltage in the range of 30 to 200 V was applied to the workpieces to maintain the workpieces at a negative potential with respect to a ground potential during film formation.

The hard films were subjected to composition analysis and Vickers hardness measurement. The composition of the hard films was measured by an EPMA. The hard films contained, in addition to Ti, V, Al, Si, B and N, O and C as impurities and had an oxygen content of 1 at. % or below and a carbon content of 2 at. % or below.

The end mills were subjected to cutting tests to evaluate the wear resistance of the hard films under the same cutting conditions as the end mills coated with the hard films in Example 1, namely, Cutting condition A and Cutting condition B. Wear width in a middle part of the edge was measured.

Table 3 shows the measured composition and measured Vickers hardness of the hard films and the results of cutting tests.

As obvious from Table 3, the hard films has the composition indicated by a chemical formula: $(Ti_aAl_bV_c)(C_{1-e}N_e)$, $(Ti_aAl_bV_cSi_d)(C_{1-e}N_e)$, $(Ti_aAl_bV_cSi_dB_f)(C_{1-e}N_e)$ or $(Ti_aAl_bV_cB_f)(C_{1-e}N_e)$. The atomic ratio e=1. Films having different atomic ratios of the component metals were formed and tested. Particularly, the atomic ratio of B was varied in a wide range.

In Table 3, Specimens Nos. 1 to 3 and 19 are the hard films in Comparative example 3, and Specimens Nos. 4 to 18 and 20 are hard films in Example 3.

The hard films in Example 3, as compared with those in Comparative example 3, have a high hardness. The wear width A and/or the wear width B of the hard films in Example 3 is small, which proves that the hard films in Example 3 are excellent in wear resistance. The hard films in Example 3 having a higher B atomic ratio have a higher hardness, a smaller wear width A and a smaller wear width B, and are more excellent in wear resistance.

Example 4

The density of the target was used as a parameter dominating the properties of hard films. Targets of (TiVAlSi), (TiVAlSiB) or (TiVAlB) respectively having different densities were made. Hard films were formed by using those targets by an AIP process or a UBMS process. The hard films were subjected to composition analysis, hardness measurement and surface roughness measurement.

Table 4 shows measured data. In Table 4, Specimens Nos. 3 to 5 and 8 to 11 are hard films in Example 4, and Specimens Nos. 1, 2, 6 and 7 are hard films in Comparative example 4.

As obvious from Table 4, the hard films in Specimens Nos. 1 to 5 of $(Ti_aAl_bV_cSi_d)(C_{1-e}N_e)$ contain free Si, the hard films in Specimens Nos. 6 to 10 of $(Ti_aAl_bV_cSi_dB_f)(C_{1-e}N_e)$ contain Si in a Ti—Si compound and B in a Ti—B compound, and the hard film in Specimen No. 11 of $(Ti_aAl_bV_cB_f)(C_{1-e}N_e)$ contains B in a Ti—B compound.

Specimens Nos. 1 to 5 are the hard films of $(Ti_aAl_bV_cSi_d)(C_{1-e}N_e)$. Among those hard films, hard films formed by using the target having a greater density have a higher hardness and a smoother surface of a smaller surface roughness Ra.

Specimens Nos. 6 to 10 are the hard films of $(Ti_aAl_bV_cSi_dB_f)(C_{1-e}N_e)$. Among those hard films, hard films formed by using the target having a greater density have a higher hardness and a smoother surface of a smaller surface roughness Ra.

The hard films in Specimens Nos. 6 to 10 of $(Ti_aAl_bV_cSi_dB_f)(C_{1-e}N_e)$ containing Si in a Ti—Si compound and B in a Ti—B compound, as compared with the hard films in Specimens Nos. 1 to 5 of $(Ti_aAl_bV_cSi_d)(C_{1-e}N_e)$ containing free Si, have smoother surfaces and a smaller surface roughness Ra. That is, the hard film containing Si in a Ti—Si compound and B in a Ti—B compound has a surface smoother than that of the hard film containing free Si and a surface roughness Ra smaller than that of the hard film containing free Si when the targets used for forming those hard films have the same density. The hard films in Specimens Nos. 1 to 10 are alike in hardness.

TABLE 1

| | Composition (Atomic ratio) | | | | | | Hardness | Wear width A | Wear width B |
|---|---|---|---|---|---|---|---|---|---|
| | Ti | V | Al | Si | B | C | N | HV | µm | µm |
| 1 | 0.5 | | 0.5 | 0 | 0 | 0 | 1 | 2700 | 50 | 600 |
| 2 | 0.25 | 0.25 | 0.5 | 0 | 0 | 0 | 1 | 2800 | 75 | 200 |
| 3 | 0.1 | 0.2 | 0.7 | 0 | 0 | 0 | 1 | 2950 | 40 | 165 |
| 4 | 0 | 0.3 | 0.55 | 0.15 | 0 | 0 | 1 | 2750 | 72 | 195 |
| 5 | 0.05 | 0.25 | 0.55 | 0.15 | 0 | 0 | 1 | 3200 | 27 | 128 |
| 6 | 0.15 | 0.15 | 0.55 | 0.15 | 0 | 0 | 1 | 3200 | 27 | 128 |
| 7 | 0.25 | 0.1 | 0.5 | 0.15 | 0 | 0 | 1 | 3186 | 28 | 121 |
| 8 | 0.6 | 0.05 | 0.3 | 0.05 | 0 | 0 | 1 | 2900 | 57 | 165 |
| 9 | 0.25 | 0.2 | 0.55 | 0 | 0 | 0 | 1 | 3000 | 40 | 138 |
| 10 | 0.25 | 0.15 | 0.55 | 0.05 | 0 | 0 | 1 | 3133 | 34 | 134 |
| 11 | 0.15 | 0.15 | 0.55 | 0.15 | 0 | 0 | 1 | 3200 | 27 | 128 |
| 12 | 0.1 | 0.1 | 0.5 | 0.3 | 0 | 0 | 1 | 3286 | 28 | 111 |
| 13 | 0.05 | 0.05 | 0.3 | 0.6 | 0 | 0 | 1 | 2850 | 62 | 170 |
| 14 | 0.2 | 0.15 | 0.65 | 0 | 0 | 0 | 1 | 3000 | 40 | 150 |
| 15 | 0.15 | 0.15 | 0.65 | 0.05 | 0 | 0 | 1 | 3161 | 23 | 146 |
| 16 | 0.14 | 0.14 | 0.65 | 0.07 | 0 | 0 | 1 | 3174 | 22 | 145 |
| 17 | 0.1 | 0.1 | 0.65 | 0.15 | 0 | 0 | 1 | 3227 | 27 | 140 |
| 18 | 0.07 | 0.03 | 0.6 | 0.3 | 0 | 0 | 1 | 2900 | 57 | 165 |
| 19 | 0.4 | 0.25 | 0.2 | 0.15 | 0 | 0 | 1 | 2700 | 77 | 185 |

TABLE 1-continued

| | Composition (Atomic ratio) | | | | | | | Hardness | Wear width A | Wear width B |
|---|---|---|---|---|---|---|---|---|---|---|
| | Ti | V | Al | Si | B | C | N | HV | μm | μm |
| 20 | 0.2 | 0.2 | 0.3 | 0.3 | 0 | 0 | 1 | 2750 | 72 | 180 |
| 21 | 0.25 | 0.2 | 0.35 | 0.2 | 0 | 0 | 1 | 3179 | 29 | 145 |
| 22 | 0.15 | 0.15 | 0.45 | 0.25 | 0 | 0 | 1 | 3239 | 27 | 135 |
| 23 | 0.1 | 0.15 | 0.6 | 0.15 | 0 | 0 | 1 | 3214 | 24 | 134 |
| 24 | 0.1 | 0.2 | 0.55 | 0.15 | 0 | 0 | 1 | 3200 | 27 | 128 |
| 25 | 0.15 | 0.15 | 0.6 | 0.1 | 0 | 0 | 1 | 3180 | 21 | 137 |
| 26 | 0.1 | 0.15 | 0.7 | 0.05 | 0 | 0 | 1 | 3174 | 22 | 135 |
| 27 | 0.07 | 0.15 | 0.75 | 0.03 | 0 | 0 | 1 | 3175 | 30 | 145 |
| 28 | 0.04 | 0.06 | 0.85 | 0.05 | 0 | 0 | 1 | 2750 | 72 | 180 |

TABLE 2

| | Composition (Atomic ratio) | | | | | | | Hardness | | |
|---|---|---|---|---|---|---|---|---|---|---|
| | Ti | V | Al | Si | B | C | N | HV | Wear width A | Wear width B |
| 1 | 0.5 | | 0.5 | 0 | 0 | 0 | 1 | 2700 | 50 | 600 |
| 2 | 0.25 | 0.25 | 0.5 | 0 | 0 | 0 | 1 | 2800 | 75 | 200 |
| 3 | 0.1 | 0.2 | 0.7 | 0 | 0 | 0 | 1 | 2950 | 40 | 165 |
| 4 | 0.15 | 0.15 | 0.45 | 0.25 | 0 | 0 | 1 | 3248 | 27 | 108 |
| 5 | 0.15 | 0.15 | 0.45 | 0.25 | 0 | 0.2 | 0.8 | 3270 | 26 | 106 |
| 6 | 0.15 | 0.15 | 0.45 | 0.25 | 0 | 0.25 | 0.75 | 3300 | 26 | 103 |
| 7 | 0.15 | 0.15 | 0.45 | 0.25 | 0 | 0.45 | 0.55 | 3310 | 28 | 110 |
| 8 | 0.15 | 0.15 | 0.45 | 0.25 | 0 | 0.7 | 0.3 | 3300 | 30 | 175 |
| 9 | 0.15 | 0.15 | 0.55 | 0.15 | 0 | 0 | 1 | 3200 | 27 | 128 |
| 10 | 0.15 | 0.15 | 0.55 | 0.15 | 0 | 0.2 | 0.8 | 3230 | 25 | 125 |
| 11 | 0.15 | 0.15 | 0.55 | 0.15 | 0 | 0.25 | 0.75 | 3260 | 27 | 122 |
| 12 | 0.15 | 0.15 | 0.55 | 0.15 | 0 | 0.45 | 0.55 | 3290 | 25 | 127 |
| 13 | 0.15 | 0.15 | 0.55 | 0.15 | 0 | 0.7 | 0.3 | 3300 | 30 | 175 |
| 14 | 0.15 | 0.15 | 0.65 | 0.05 | 0 | 0 | 1 | 3250 | 22 | 138 |
| 15 | 0.15 | 0.15 | 0.65 | 0.05 | 0 | 0.2 | 0.8 | 3280 | 20 | 135 |
| 16 | 0.15 | 0.15 | 0.65 | 0.05 | 0 | 0.25 | 0.75 | 3300 | 22 | 133 |
| 17 | 0.15 | 0.15 | 0.65 | 0.05 | 0 | 0.45 | 0.55 | 3310 | 23 | 145 |
| 18 | 0.15 | 0.15 | 0.65 | 0.05 | 0 | 0.7 | 0.3 | 3300 | 30 | 175 |

TABLE 3

| | Composition (Atomic ratio) | | | | | | | Hardness | | |
|---|---|---|---|---|---|---|---|---|---|---|
| | Ti | V | Al | Si | B | C | N | HV | Wear width A | Wear width B |
| 1 | 0.5 | 0 | 0.5 | 0 | 0 | 0 | 1 | 2700 | 50 | 600 |
| 2 | 0.25 | 0.25 | 0.5 | 0 | 0 | 0 | 1 | 2800 | 75 | 200 |
| 3 | 0.1 | 0.2 | 0.7 | 0 | 0 | 0 | 1 | 2950 | 40 | 165 |
| 4 | 0.15 | 0.15 | 0.55 | 0.15 | 0 | 0 | 1 | 3200 | 27 | 128 |
| 5 | 0.15 | 0.15 | 0.55 | 0.13 | 0.02 | 0 | 1 | 3215 | 26 | 126 |
| 6 | 0.12 | 0.15 | 0.55 | 0.13 | 0.05 | 0 | 1 | 3218 | 25 | 126 |
| 7 | 0.13 | 0.12 | 0.55 | 0.13 | 0.07 | 0 | 1 | 3220 | 25 | 126 |
| 8 | 0.1 | 0.12 | 0.55 | 0.1 | 0.13 | 0 | 1 | 3150 | 32 | 133 |
| 9 | 0.1 | 0.1 | 0.5 | 0.1 | 0.2 | 0 | 1 | 3100 | 37 | 130 |
| 10 | 0.15 | 0.15 | 0.65 | 0.05 | 0 | 0 | 1 | 3250 | 22 | 138 |
| 11 | 0.13 | 0.15 | 0.65 | 0.05 | 0.02 | 0 | 1 | 3207 | 22 | 142 |
| 12 | 0.13 | 0.12 | 0.65 | 0.05 | 0.05 | 0 | 1 | 3210 | 21 | 142 |
| 13 | 0.1 | 0.13 | 0.65 | 0.05 | 0.07 | 0 | 1 | 3212 | 21 | 141 |
| 14 | 0.1 | 0.1 | 0.62 | 0.05 | 0.13 | 0 | 1 | 3200 | 27 | 138 |
| 15 | 0.05 | 0.1 | 0.6 | 0.05 | 0.2 | 0 | 1 | 3150 | 32 | 140 |
| 16 | 0.17 | 0.15 | 0.65 | 0 | 0.03 | 0 | 1 | 3150 | 27 | 140 |
| 17 | 0.15 | 0.15 | 0.65 | 0 | 0.07 | 0 | 1 | 3200 | 25 | 126 |
| 18 | 0.15 | 0.15 | 0.65 | 0 | 0.08 | 0 | 1 | 3150 | 27 | 140 |
| 19 | 0.15 | 0.15 | 0.65 | 0 | 0.13 | 0 | 1 | 2950 | 40 | 165 |
| 20 | 0.2 | 0.1 | 0.65 | 0 | 0.05 | 0 | 1 | 3100 | 37 | 130 |

TABLE 4

| | Composition (Atomic ratio) | | | | | Condition of Si and B | Density | Hardness of film | Surface roughness of film (Ra) |
|---|---|---|---|---|---|---|---|---|---|
| | Ti | V | Al | Si | B | Si | % | Hv | μm |
| 1 | 0.15 | 0.15 | 0.55 | 0.15 | 0 | Si | 90 | 3040 | 0.13 |
| 2 | 0.15 | 0.15 | 0.55 | 0.15 | 0 | Si | 91 | 3090 | 0.1 |
| 3 | 0.15 | 0.15 | 0.55 | 0.15 | 0 | Si | 96 | 3150 | 0.07 |
| 4 | 0.15 | 0.15 | 0.55 | 0.15 | 0 | Si | 98 | 3170 | 0.07 |
| 5 | 0.15 | 0.15 | 0.55 | 0.15 | 0 | Si | 100 | 3200 | 0.06 |
| 6 | 0.13 | 0.12 | 0.65 | 0.05 | 0.05 | Ti5Si3, TiB2 | 90 | 3040 | 0.11 |
| 7 | 0.13 | 0.12 | 0.65 | 0.05 | 0.05 | Ti5Si3, TiB2 | 91 | 3090 | 0.08 |
| 8 | 0.13 | 0.12 | 0.65 | 0.05 | 0.05 | Ti5Si3, TiB2 | 96 | 3150 | 0.05 |
| 9 | 0.13 | 0.12 | 0.65 | 0.05 | 0.05 | Ti5Si3, TiB2 | 98 | 3170 | 0.05 |
| 10 | 0.13 | 0.12 | 0.65 | 0.05 | 0.05 | Ti5Si3, TiB2 | 100 | 3200 | 0.04 |
| 11 | 0.13 | 0.12 | 0.65 | 0 | 0.05 | TiB2 | 100 | 3100 | 0.05 |

Although the invention has been described in its preferred embodiments with a certain degree of particularity, obviously many changes and variations are possible therein. It is therefore to be understood that the present invention may be practiced otherwise than as specifically described herein without departing from the scope and spirit thereof.

What is claimed is:

1. A hard film formed of a material having composition indicated by a chemical formula: $(Ti_a Al_b V_c Si_d B_f)(C_{1-e} N_e)$;
   wherein subscripts a, b, c, d, e and f indicate atomic ratios of Ti, Al, V, Si, N and B, respectively, and meet relational expressions:
   $0.02 \leq a \leq 0.5$
   $0.4 < b \leq 0.8$
   $0.05 < c$
   $0 \leq d \leq 0.5$
   $0 \leq f \leq 0.1$
   $0.01 \leq d+f \leq 0.5$
   $0.5 \leq e \leq 1$
   $a+b+c+d+f=1$.

2. The hard film according to claim 1, wherein said atomic ratios meet expressions:
   $f=0$
   $0.01 \leq d \leq 0.5$.

3. The hard film according to claim 1, wherein said atomic ratios meet expressions:
   $d=0$
   $0.01 \leq f \leq 0.1$.

4. The hard film according to claim 1, wherein said atomic ratios meet expressions:
   $0.01 \leq d \leq 0.5$
   $0.01 \leq f \leq 0.1$.

5. A hard film forming method of forming the hard film according to claim 1 comprising the steps of:
   evaporating and ionizing component metals of a target in a film-forming gas; and
   producing a plasma by promoting ionization of the metals and the film-forming gas.

6. The hard film forming method according to claim 5, wherein the component metals of the target are evaporated and ionized by an arc-ionization plating process using arc discharge, and a magnetic field represented by diverging or parallel lines of magnetic force extending forward substantially perpendicularly to an evaporating surface of the target is created to promote the ionization of the film-forming gas around a workpiece for film formation.

* * * * *